United States Patent [19]

Phelps, Jr. et al.

[11] Patent Number: 4,796,078
[45] Date of Patent: Jan. 3, 1989

[54] PERIPHERAL/AREA WIRE BONDING TECHNIQUE

[75] Inventors: Douglas W. Phelps, Jr., Burlington; Robert J. Redmond, Essex Junction; William C. Ward, Burlington, all of Vt.

[73] Assignee: International Business Machines Corporation, Armonk, N.Y.

[21] Appl. No.: 61,361

[22] Filed: Jun. 15, 1987

[51] Int. Cl.$^4$ .................... H01L 23/48; H01L 23/30; H02G 13/08
[52] U.S. Cl. ........................ 357/68; 357/69; 357/70; 357/72; 174/52.4
[58] Field of Search ............ 357/68, 70, 69, 72, 357/80; 174/52 FP

[56] References Cited

U.S. PATENT DOCUMENTS

| | | | |
|---|---|---|---|
| 3,838,984 | 10/1974 | Crane et al. | 174/52 FP |
| 4,330,790 | 5/1982 | Burns | 357/70 |
| 4,438,181 | 3/1984 | Schroeder | 357/70 |
| 4,496,965 | 1/1985 | Orcutt et al. | 357/70 |
| 4,675,985 | 6/1987 | Goto | 357/72 |

FOREIGN PATENT DOCUMENTS

| | | | |
|---|---|---|---|
| 53-72456 | 6/1978 | Japan | 357/70 |
| 60-20525 | 2/1985 | Japan | 357/68 |
| 61-242051 | 4/1985 | Japan | 357/70 |
| 61-12053 | 1/1986 | Japan | 357/70 |
| 81/03396 | 11/1981 | World Int. Prop. O. | 357/70 |

*Primary Examiner*—Martin H. Edlow
*Assistant Examiner*—Gregory A. Key
*Attorney, Agent, or Firm*—Sughrue, Mion, Zinn, Macpeak, and Seas

[57] ABSTRACT

An electronic assembly having a semiconductor device back bonded to a first lead frame. An adhesive insulative tape is placed on the first lead frame and the device. A second lead frame is mounted on the adhesive tape. Electrical contacts by wire bonds are established between the device and the first and second lead frames.

18 Claims, 1 Drawing Sheet

PERIPHERAL/AREA WIRE BONDING TECHNIQUE

BACKGROUND OF THE INVENTION

1. Field of the Invention

This invention relates to a system for improving the wire density in integrated circuit devices, such as chips and dies. In particular, this invention relates to the method and resulting structure for utilizing at least two lead frames to provide both peripheral and central area wiring to an integrated circuit device. Additionally, this invention employs an insulative adhesive tape to provide alignment, hold-down, and insulation for the lead frames.

2. Description of the Prior Art

Within the prior art a variety of devices are known for utilizing lead frame techniques in an attempt to improve wiring density and decrease production costs. For example U.S. Pat. No. 4,496,965 illustrates the use of two lead frames which are inter-digitated to improve the wiring density at the integrated circuit. That is, the leads from one frame alternate with the leads of from a second frame which are disposed in an essentially co-planar relationship. The lead frame patterns are stacked and joined into a co-planar configuration to increase the lead density at the semiconductor chip edge for peripheral bonding. The technique while improving bonding at the periphery of the device is not suitable for area wire bond capability or to provide engineering change capability at the periphery of the circuit board. Additionally, in the '965 patent, thermal performance is not enhanced because of the absence of lead frame lamination to the major surface of the semiconductor chip.

Reference is made to U.S. Pat. No. 3,999,285 which illustrates the use of a single lead frame separated by a pair of adhesive filled woven fiber mats. The technique while providing adhesive to bond the lead frame and therefore decrease manufacturing costs, does not employ plastic packaging techniques of the chip and, like the '965 patent does not provide for area wire bonding capability or engineering change capability of the periphery of the device circuit board. Other examples of the use of adhesive tape to maintain part alignment are illustrated in U.S. Pat. No. 4,480,150 wherein an adhesive is used to maintain part alignment orientation after tag trimming operations of the lead frame.

The use of adhesives in semiconductor devices for purposes of maintaining part alignment and therefore attempting to decrease manufacturing costs are illustrated in U.S. Pat. Nos. 3,871,018 and 4,461,924. In the '018 patent top metal and bottom metal base covers are cleaned/oxidized then coated with a high temperature glass frit layer. This is followed by additional low temperature glass frit application to the base lid which is reflow bonded to the lead frame. An epoxy coating on the top lid with the lead frame attachment creates a metal package enclosure. In the '924 patent the package employs a top metal housing in a bottom metal base. The single lead frame is adhesively bonded to both sides of the top and bottom base and cover metals to create a metal package enclosure.

Other examples of tab bonding utilizing tape or a single level lead frame utilizing an alternative technique to maintain alignment, springs are illustrated respectively in U.S. Pat. Nos. 4,438,181 and 3,621,114.

While the prior art is replete with a number of concepts to utilize single lead frames held by an adhesive or, having essentially co-planar multiple lead frame technologies, the prior art is devoid of any recognition that vertically displaced lead frames can be used to provide not only peripheral but center bonding to semiconductor devices. Additionally, while the prior art recognizes the use of plastic molding of the completed lead frame and integrated circuit device, such as used in the context of a co-planar lead frame technology.

A solution to many of these problems is achieved in the system described and claimed in commonly assigned U.S. patent application Ser. No. 940,235 filed Dec. 8, 1986 and entitled "Package Semiconductor Chip." In the system proposed in that application a lead frame is adhesively attached to a major surface of a semiconductor chip, such as the top surface. A dielectric layer serving as an alpha barrier is placed between the chip and the lead frame and joined to both. Wires are used to establish contact to terminal pads on the center of the semiconductor chip. This system represents a material advance by providing access to the center portion of the chip. However, increased lead density and access to both the center and periphery of the chip remain as problems.

SUMMARY OF THE INVENTION

Given the deficiencies of the prior art, it is an object of this invention to provide multiple lead frame systems to bond both the peripheral input/output pads and the center pads on an integrated circuit chip.

Another object of this invention is to utilize an adhesive tape which provides an insulative technique to separate vertically spaced lead frames yet maintain alignment with subsequent manufacturing steps.

Yet another object of this invention is to define a method of making an integrated circuit having increased lead density yet is capable of being packaged in a plastic molded housing.

These and other objects of this invention are accomplished by a method wherein an integrated circuit device is back bonded to a recessed chip mount pad in a first lead frame. The peripheral pads are then wire bonded providing the circuit connections from the integrated circuit to the first lead frame.

Next, in accordance with this invention, an adhesive insulative tape is applied to both the first lead frame and the integrated circuit device. Preferably, the tape is applied in parallel strips on the periphery of the first lead frame so that it is positioned on the integrated circuit between the peripheral and center pads. Then, a second preformed lead frame is placed on top of the adhesive tape. Wire bonds to the center pads on the integrated circuit device are then made. The device is then encapsulated in a molded plastic body and the terminals on the lead frames extend from the periphery of the body to make contact with pads on the circuit board.

In accordance with this invention the completed module therefore employs two lead frames which are spaced vertically and insulated from each other by means of an adhesive tape applied to both the first lead frame and the integrated circuit device. The lead frame terminals then extend out the periphery of a plastic package which is molded about the completed subassembly.

Thus, in accordance with this invention, the resulting method allows wire bonding and plastic molding of chips containing both peripheral and area input/output pads. The formed overlayer lead frame provides a planar interleaved or overleaved leads exit from the package.

By the use of a two-sided adhesive tape stabilization of the formed overlayed frame on the chip surface for wire bonding occurs. The resulting structure provides complete alpha protection.

The resulting structure has a single mold part line having double interleaved or overlayered leads allowing the use of conventional molding tooling and processes well known in the art. The package has increased thermal performance yet reduces line loss. Improved package input/output lead capability results by the increased lead density to both the peripheral and the area (central) pads on the semiconductor device.

This invention will be described in greater detail by referring to the attached drawing and the description of the preferred embodiment that follows.

DESCRIPTION OF THE PREFERRED EMBODIMENT

Figure 1A:
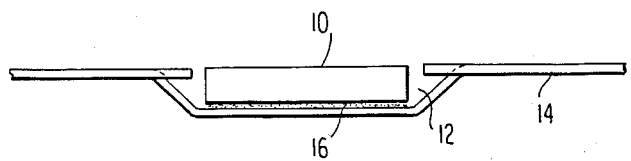
FIG. 1A is a schematic side view of an intermediate stage of fabrication of the device in accordance with this invention.

Referring now to FIG. 1A an intermediate stage of manufacture of this device is first portrayed. An integrated circuit device is placed in a recessed chip mount pad 12 of a first lead frame 14. Such a lead frame is well known in the art as represented by the prior art discussed herein. The integrated circuit chip is back bonded in the zone 16 to anchor the device onto the frame. As used herein, the term "chip" is generic to known semiconductor devices. Back bonding uses a suitable adhesive such as epoxies and polyimides.

A double sided adhesive tape 24 is placed on both the lead frame 14 and the top of the semiconductor device 10. The tape is typically, high temperature polyimide film such as duPont Kapton TM having two sided adhesive which is typically a phenolic or polyimide, silicone or acrylic material or combination thereof. Thus the tape 24 is a three layer composite of polyimide film coated with adhesive. Preferably the tape is applied as parallel strips across the periphery of the lead frame and to the semiconductor device in zones between the peripheral pads 22 and a central pads 26. That is, the tape 24 is applied to both the top surface of the chip, to the inner lead frame conductors and over the dam bar. The tape also serves as an insulator and an alpha barrier. Such are well known as in U.S. Pat. No. 4,426,647. The barrier may be between 1.6 and 2 mils thick.

Figure 1B:
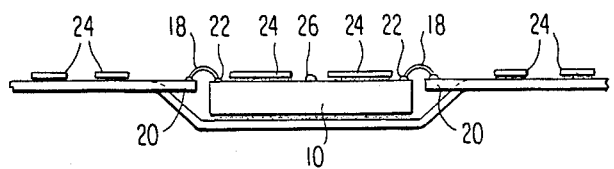
FIG. 1B is a schematic side view of a subsequent method step in accordance with this invention.

Then, as illustrated in FIG. 1B a series of wire bonds 18 extend from a lead frame finger 20 to a peripheral pad 22 located on a major surface device 10. It will be understood that while FIG. 1B illustrates two such connections, there may be a plurality of such peripheral pads 22 around the device 10 with elective bonding as the circuitry so requires. Alternatively, the wire bonds 18 may be made before the tape 24 is placed down.

Figure 1C:
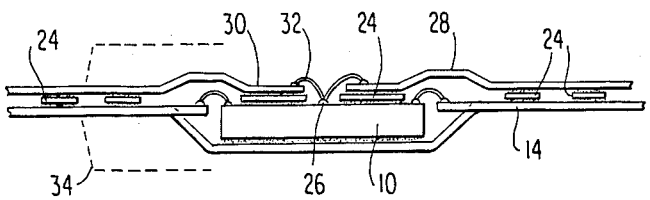
FIG. 1C is a schematic side view of a further manufacturing process in accordance with this invention.

FIG. 1C shows the next intermediate step in the manufacture of the module in accordance with this invention. A second lead frame 28 is placed over the tape 24. Alternatively, tape 24 may be placed on lead frame 28 prior to placement of the lead frame 28, over the assembly illustrated in FIG. 1B, (in such a step, the tape would not be present on frame 14 or device 10). As illustrated in FIG. 1C, the second lead frame 28 has its fingers 30 resting on the tape areas 24 on the semiconductor device 10. Then, the, lead frame fingers 30 have selected wire bonds made to the central terminals 26 via wires 32. The module processing then proceeds to the formation of a molded plastic body 34 which encapsulates both lead frames and the semiconductor chip. The molding is typically by known transfer molding techniques. Following encapsulation lead frame selvage is removed.

Figure 2:
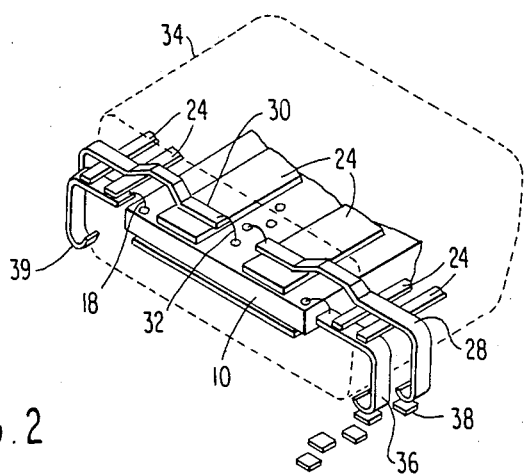
FIG. 2 is an isometric cut-away view illustrating the completed modular assembly.

As illustrated in FIG. 2 the terminals of both the two lead frames provide contacts to pads 36, 38 on an integrated circuit board to which completed subassembly are mounted. As illustrated in FIG. 2, the peripherally extending terminal leads of both lead frames 14 and 28 protrude through the sides of the package 34 and are turned downward to form "J lead" contact surfaces 39. It will be appreciated that while only two such leads are illustrated on each side, in fact there will be many such leads in the intricacy of such lead frames.

As can be seen then from FIG. 2, the completed package provides two lead frames which provide both wire bonds on the peripheral input/output pads but also in the center area input/output pads of the semiconductor device. The package allows for wire bonding and plastic molding of chips which contain both peripheral and area input/output pads.

By the use of a two sided adhesive tape on the first lead frame, stabilization for the second lead frame occurs. The package allows for reduced line loss due to the shorter area wire lengths which may be used. This in turn increases the package I/O capability.

This invention, by separating the leads both horizontally as well as vertically and to different rows of pads, allows for electrical decoupling of leads. Thus, power distribution and signal paths may be decoupled by proper assignment of leads to minimize crosstalk.

The insulative tape provides increased thermal performance by providing a discreet zone of separation between the two lead frames and more particularly, the upper lead frame 28 laminated to chip major surface. Such is important as packing density increases.

The invention also provides for flexibility heretofore not known in this technology. By the use of at least two vertically displaced frames customized lead output location may occur. Moreover, as illustrated in FIG. 2, engineering change capability is provided through alterable I/O avoiding chip redesign at the card or the circuit board level.

This invention while shown applicable to a generic integrated circuit device, is also applicable to quad lead packages, small outline packaging and hybrid packaging techniques. That is, it can be used with both ceramic as well as plastic packaging. Importantly, the package provides complete alpha protection to the chip.

While the invention has been described with respect to its preferred embodiments, modifications are within the scope thereof. For example, more than two lead frames may be used, each stacked and separated as illustrated with respect to the two illustrated frames.

What is claimed is:

1. A electronic assembly comprising:
a first lead frame having a number of projecting leads;

an electronic device mounted on said first lead frame, said electronic device having a series of peripheral and center contact pads, means to establish electric contact between said first lead frame and said peripheral contact pads;

an adhesive insulative tape on both said first lead frame and said electronic device;

a second lead frame having a number of projecting leads and mounted on said tape, and means to establish electric contact between said center contact pads and the leads of said second lead frame.

2. The assembly of claim 1, wherein said first lead frame has a recess and said electronic device is back bond mounted in said recess.

3. The assembly of claim 2, wherein said leads of said first lead frame and said peripheral contact pads are substantially co-planar.

4. The assembly of claim 1, wherein said adhesive tape is applied in parallel strips on both said first lead frame and said electronic device.

5. The assembly of claim 4, wherein strips of adhesive are applied on said electronic device between said center contact pads and said peripheral pads.

6. The assembly of claim 1, wherein said first and second lead frames further comprise outwardly extending contact leads adapted to contact pads on an external circuit board.

7. The assembly of claim 6, further comprising a package encapsulating said electronic device and said first and second lead frames excluding said outwardly extending contact leads.

8. The assembly of claim 1, wherein said leads of said second lead frame extend over said electronic device.

9. The assembly of claim 1, wherein said adhesive insulative tape comprises a laminated structure having a polyimide center and outer adhesive tape layers.

10. An electronic assembly comprising:
first and second lead frames stacked and separated from each other by an insulative adhesive material;

an electronic device mounted on said first lead frame, said electronic device having center and peripheral contact pads, said electronic device further having insulative adhesive tape material applied thereto to separate said second lead frame from said electronic device; and means to establish electric contact between said electronic device and said first and second lead frames.

11. The assembly of claim 10, wherein said first lead frame has a recess and said electronic device is back bond mounted in said recess.

12. The assembly of claim 11, wherein said leads of said first lead frame and said peripheral contact pads are substantially co-planar.

13. The assembly of claim 10, wherein said adhesive tape is applied in parallel strips on both said first lead frame and said electronic device.

14. The assembly of claim 13, wherein strips of adhesive are applied on said electronic device between said center contact pads and said peripheral pads.

15. The assembly of claim 10, wherein said first and second lead frames further comprise outwardly extending contact leads adapted to contact pads on an external circuit board.

16. The assembly of claim 15, further comprising a package encapsulating said electronic device and said first and second lead frames excluding said outwardly extending contact leads.

17. The assembly of claim 10, wherein said leads of said second lead frame extend over said electronic device.

18. The assembly of claim 10, wherein said adhesive insulative tape comprises a laminated structure having a polyimide center and outer adhesive layers.

* * * * *